(12) United States Patent
Partridge et al.

(10) Patent No.: US 11,990,908 B1
(45) Date of Patent: May 21, 2024

(54) DUAL-MEMS DEVICE WITH TEMPERATURE CORRECTION OF MEMS OUTPUT BASED ON RELATIVE MEMS OPERATION

(71) Applicant: SiTime Corporation, Santa Clara, CA (US)

(72) Inventors: Aaron Partridge, Cupertino, CA (US); Samira Zaliasl, Jersey City, NJ (US); Meisam Heidarpour Roshan, Sunnyvale, CA (US); Sassan Tabatabaei, Sunnyvale, CA (US)

(73) Assignee: SiTime Corporation, Santa Clara, CA (US)

(*) Notice: Subject to any disclaimer, the term of this patent is extended or adjusted under 35 U.S.C. 154(b) by 865 days.

(21) Appl. No.: 16/807,979

(22) Filed: Mar. 3, 2020

Related U.S. Application Data

(62) Division of application No. 16/292,198, filed on Mar. 4, 2019, now Pat. No. 10,622,973, which is a division of application No. 15/264,583, filed on Sep. 13, 2016, now Pat. No. 10,247,621.

(60) Provisional application No. 62/382,735, filed on Sep. 1, 2016, provisional application No. 62/289,479, filed on Feb. 1, 2016, provisional application No. 62/217,950, filed on Sep. 13, 2015.

(51) Int. Cl.
*G01K 7/32* (2006.01)
*H03K 3/03* (2006.01)
*H03L 1/02* (2006.01)
*H03L 7/099* (2006.01)
*H03L 7/18* (2006.01)
*H03L 7/197* (2006.01)

(52) U.S. Cl.
CPC .......... *H03K 3/0315* (2013.01); *G01K 7/32* (2013.01); *H03L 1/027* (2013.01); *H03L 7/0991* (2013.01); *H03L 7/18* (2013.01); *H03L 7/1976* (2013.01)

(58) Field of Classification Search
CPC ....... H03K 3/0315; G01K 7/32; H03L 1/027; H03L 7/0991; H03L 7/1976
USPC .................................................. 374/170, 178
See application file for complete search history.

(56) References Cited

U.S. PATENT DOCUMENTS 4,493,565 A   1/1985   Saka
5,365,468 A   11/1994  Kakubo et al.
(Continued)

FOREIGN PATENT DOCUMENTS

CN   202988703 U  *  6/2013
CN   113702663 A  *  11/2021
(Continued)

OTHER PUBLICATIONS

16807979_2024-01-10_CN_202988703_U_H.pdf,Jun. 21, 2007.*
(Continued)

*Primary Examiner* — Gail Kaplan Verbitsky

(57) ABSTRACT

In a high resolution temperature sensor, first and second MEMS resonators generate respective first and second clock signals and a locked-loop reference clock generator generates a reference clock signal having a frequency that is phase-locked to at least one of the first and second clock signals. A frequency-ratio engine within the MEMS temperature sensor oversamples at least one of the first and second clock signals with the reference clock signal to generate a ratio of the frequencies of the first and second clock signals.

17 Claims, 3 Drawing Sheets

(56) References Cited

U.S. PATENT DOCUMENTS

| | | | |
|---|---|---|---|
| 6,107,946 A | 8/2000 | Jeong | |
| 6,563,448 B1 | 5/2003 | Fontaine | |
| 6,768,207 B2 * | 7/2004 | Tao | H01L 23/10 |
| | | | 257/E21.705 |
| 7,369,004 B2 * | 5/2008 | Partridge | H03B 5/30 |
| | | | 331/116 M |
| 7,446,619 B2 | 11/2008 | Partridge et al. | |
| 7,446,620 B2 | 11/2008 | Partridge et al. | |
| 7,545,228 B1 | 6/2009 | Lu et al. | |
| 8,058,933 B2 | 11/2011 | Frank et al. | |
| 8,299,826 B2 | 10/2012 | Perrott | |
| 8,538,258 B2 | 9/2013 | Suvakovic | |
| 8,686,771 B2 | 4/2014 | Frantzeskakis et al. | |
| 8,786,341 B1 | 7/2014 | Weltin-Wu et al. | |
| 9,022,644 B1 | 5/2015 | Arft et al. | |
| 9,182,295 B1 | 11/2015 | Perrott et al. | |
| 2005/0163276 A1 | 7/2005 | Sudo | |
| 2008/0007362 A1 | 1/2008 | Partridge et al. | |
| 2009/0278619 A1 * | 11/2009 | Partridge | H03B 5/04 |
| | | | 331/154 |
| 2009/0302958 A1 | 12/2009 | Sakurai et al. | |
| 2010/0116043 A1 | 5/2010 | Pannek et al. | |
| 2012/0043999 A1 * | 2/2012 | Quevy | H03L 7/18 |
| | | | 327/147 |
| 2012/0229220 A1 | 9/2012 | Quevy et al. | |
| 2013/0192372 A1 | 8/2013 | Colinet et al. | |
| 2014/0166461 A1 * | 6/2014 | Goodnow | H01H 59/0009 |
| | | | 200/600 |
| 2014/0306771 A1 | 10/2014 | Malpass | |
| 2016/0118954 A1 | 4/2016 | Clark | |
| 2018/0087894 A1 | 3/2018 | Hagelin | |
| 2019/0131952 A1 * | 5/2019 | Valzasina | H03B 5/04 |
| 2021/0053819 A1 * | 2/2021 | deKoninck | B81B 7/0087 |

FOREIGN PATENT DOCUMENTS

| | | | | |
|---|---|---|---|---|
| CN | 115655304 A | * | 1/2023 | |
| EP | 1089109 A2 | * | 4/2001 | B81B 3/0054 |
| EP | 2472717 A2 | * | 7/2012 | H01H 9/30 |
| EP | 3477852 B1 | * | 1/2021 | H03B 5/04 |
| JP | 2007155714 A | * | 6/2007 | B81B 7/007 |
| JP | 2013150244 A | * | 8/2013 | H03L 1/022 |
| JP | 2013205266 A | * | 10/2013 | |
| RU | 129625 U1 | * | 6/2013 | |
| WO | WO-2019048737 A1 | * | 3/2019 | B81B 3/0081 |

OTHER PUBLICATIONS

16807979_2024-01-10_JP_2007155714_A_H.pdf, Jun. 12, 2013.*

Heidary et al. "A BJT-based CMOS temperature sensor with a 3.6pJ•K2-resolution FoM," ISSCC Dig. Tech. Papers, pp. 224-225, Feb. 2014.

K.A.A. Makinwa, "Temperature Sensor Performance Survey," available online at http://ei.ewi.tudelft.nl/docs/TSensor_survey.xls as of Aug. 31, 2015, 3 pages.

Ng et al., "Stability of Silicon Microelectromechanical Systems Resonant Thermometers," IEEE J. Sensors, vol. 13, No. 3, pp. 987-993, Mar. 2013.

Park et al., "A Thermistor-Based Temperature Sensor for a Real-Time Clock With ±2 ppm Frequency Stability," IEEE J. Solid-State Circuits, vol. 50, No. 7, pp. 1571-1580, Jul. 2013.

Perrott et al., "A Modeling Approach for Σ-Δ Fractional-N Frequency Synthesizers Allowing Straightforward Noise Analysis," IEEE J. Solid-State Circuits, vol. 37, No. 8, pp. 1028-1038, Aug. 2013.

Perrott et al., "A Temperature-to-Digital Converter for a MEMS-based Programmable Oscillator with < ±0.5-ppm Frequency Stability and < 1-ps Integrated Jitter," IEEE J. Solid-State Circuits, vol. 48, No. 1, pp. 276-291, Jan. 2013.

Schodowski et al., "Microcomputer-Compensated Crystal Oscillator for Low-Power Clocks", U.S. Army Electronics and Technology Devices Laboratory, Nov. 1989, pp. 445-465.

Weng et al., "A Cmos Thermistor-Embedded Continuous-Time DeltaSigma Temperature Sensor with a Resolution of 0.01° C.," IEEE Asscc, pp. 149-152, Nov. 2014.

Zaliasl et al., "A 3 ppm 1.5 x 0.8 mm2 1.0 μA 32.768 kHz MEMS-Based Oscillator," IEEE J. Solid-State Circuits, vol. 50, No. 1, pp. 291-302, Jan. 2015.

* cited by examiner

Frequency Detector/Counter

US 11,990,908 B1

DUAL-MEMS DEVICE WITH TEMPERATURE CORRECTION OF MEMS OUTPUT BASED ON RELATIVE MEMS OPERATION

CROSS-REFERENCE TO RELATED APPLICATIONS

This application is a division of U.S. patent application Ser. No. 16/292,198 filed Mar. 4, 2019, which in turn is a division of U.S. patent application Ser. No. 15/264,583 filed Sep. 13, 2015 (now U.S. patent Ser. No. 10/247,621), which claims priority to each of the following U.S. Provisional patent applications: Application No. 62/217,950, filed Sep. 13, 2015; Application No. 62/289,479, filed Feb. 1, 2016; and Application No. 62/382,735, filed Sep. 1, 2016. Each of the foregoing applications is hereby incorporated by reference.

TECHNICAL FIELD

The disclosure herein relates to electronic systems, devices and component circuits for high resolution temperature sensing.

BRIEF DESCRIPTION OF THE DRAWING

The various embodiments disclosed herein are illustrated by way of example, and not by way of limitation, in the figures of the accompanying drawings and in which.

DETAILED DESCRIPTION

In various embodiments disclosed herein, a temperature-dependent frequency difference or temperature-dependent frequency ratio between two clock signals is quantified to yield a temperature detection signal. In a number of embodiments, an oversampling and/or output-decimating frequency ratio engine generates a digital output corresponding to the frequency ratio of two resonator-sourced clock signals and thus a digital output that changes with temperature (i.e., temperature-to-digital converter or "TDC"). In the output-decimating case, the data rate of the digital temperature-sense output is reduced to meet timing and/or power constraints within downstream circuitry (e.g., a sigma-delta modulator as discussed in connection with one embodiment). In oversampling embodiments (which generally may also include output data decimation), an additional sampling clock generator is provided to enable rapid quantization of resonator clock phases and thereby speed convergence/determination of the TDC output. Further, in a number of oversampling embodiments, the sampling clock generator is phase locked to one or both of the resonator-sourced clock signals to reduce 1/F noise and thereby improve temperature resolution. In general, such oversampling embodiments enable temperature resolution as low as (or lower than) 20° K at bandwidths as high as (or higher than) 100 Hz while dissipating as little as (or less than) 19 mW low power, yielding the best energy-efficiency reported for integrated temperature sensors to date with figures of merit (FOMs) as low as (or lower than) 0.04 pJK2—more than an order of magnitude better than that of highest-performance alternatives. When applied within a temperature compensating circuit, temperature sensor embodiments presented herein permit implementation of a programmable oscillator with an Allan Deviation as low or lower than 1e–10 over a one-second averaging time, and a frequency stability as low as or lower than 100 ppb (parts-per billion) over an exemplary temperature range from –45° C. to +105° C.

Figure 1:
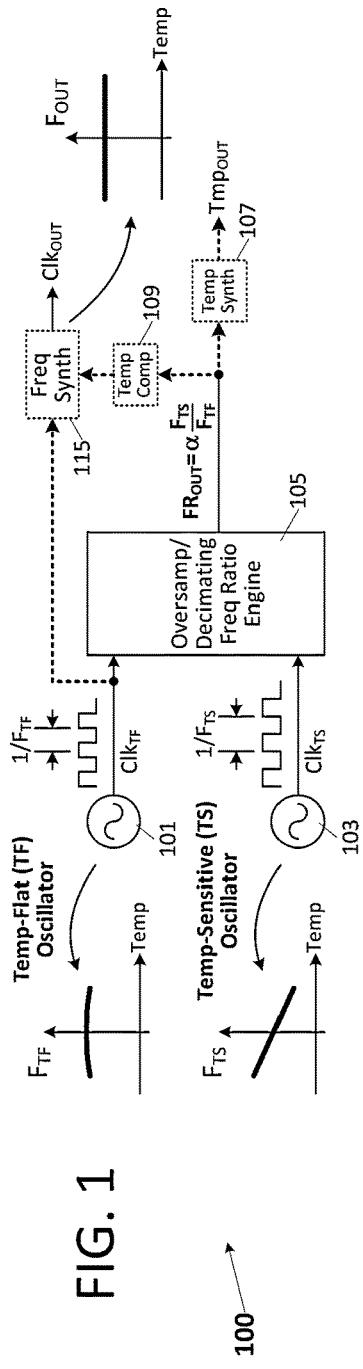
FIG. 1 illustrates a generalized embodiment of a dual-resonator temperature sensor having a pair of oscillators and a frequency ratio engine.

FIG. 1 illustrates a generalized embodiment of a temperature sensor 100 having a pair of oscillators 101, 103 and a frequency ratio engine 105. In the implementation shown, the two oscillators have different nominal frequencies as well as non-uniform (disparate) temperature coefficients of frequency (TCFs), with oscillator 101, referred to herein as the temperature-flat or "temp-flat" oscillator, exhibiting a relatively slight temperature dependence over a temperature range of interest (e.g., −45° C. to +105° C.) and the other "temp-sensitive" oscillator 103 exhibiting a more pronounced temperature dependence over that same range. In a number of embodiments, temp-sensitive oscillator 103 oscillates at a lower frequency ($F_{TS}$) than temp-flat oscillator 101 ($F_{TF}$) at the coldest end of the temperature range of interest with $F_{TS}$ dropping more rapidly than $F_{TF}$ as temperature increases over the range of interest so that the frequency ratio $F_{TS}/F_{TF}$ monotonically decreases as temperature rises. While these exemplary $F_{TF}$ and $F_{TS}$ relations and temperature-dependencies are carried forward in various embodiments and examples below, in all cases oscillators having different temperature-dependency profiles and relative frequencies may be used, so long as the oscillators do not exhibit proportional frequency changes over a temperature range of interest in a frequency-ratiometric temperature sensor or uniform frequency changes over a temperature range of interest in a frequency-differencing temperature sensor (e.g., as discussed below). Additionally, while the temp-flat and temp-sensitive oscillators are generally described herein as resonator-sourced oscillators (i.e., oscillators that yield an output waveform according to the resonant frequency of a mechanical structure) and more specifically as oscillators having respective MEMS (micro-electromechanical system) resonator components, any practicable oscillators may be used in alternative embodiments, including oscillators that lack a resonant mechanical structure, and resonator-sourced oscillators other than MEMS-resonator-sourced oscillators (e.g., quartz oscillators and the like).

Still referring to FIG. 1, frequency ratio engine 105 performs at least one of an oversampling function or a data output decimation function (performing both such functions in a number of embodiments discussed below) to yield a digitized frequency ratio as a monotonic but nonlinear function of temperature (alternative embodiments may yield non-monotonic functions of temperature, including functions having discontinuous domains). Consequently, by precharacterizing the TCFs of oscillators 101 and 103 over a frequency range of interest, and mapping the TCF(s) to a corrective polynomial implemented within optional temperature synthesizer 107 (i.e., polynomial that corrects for nonlinearity in the frequency-ratio over temperature to yield a linear function), an absolute or relative temperature output ($Tmp_{OUT}$) may be generated. Similarly, nonlinearity in the frequency ratio ($FR_{OUT}$) and the temp-flat oscillator 101 may be correlated within temperature compensator 109 to yield a more temperature stable output clock within frequency synthesizer 115 (i.e., $Clk_{OUT}$) than possible within temp-flat oscillator 101 alone. In one embodiment, for example, $Clk_{TF}$ is temperature compensated to effect an output clock ($Clk_{OUT}$) having a frequency error within ±0.1 ppm (part per million) or less over a broad operational temperature range (e.g., −45° C. to +105° C.). Further, though the frequency ratio output is shown in FIG. 1 and other embodiments below as a scaled ratio of the temp-sensitive oscillator frequency ($F_{TS}$) to the temp-flat oscillator frequency ($F_{TF}$), that ratio may be inverted in alternative embodiments ($\alpha F_{TF}/F_{TS}$), expressed as a frequency error ($1-\alpha F_{TS}/F_{TF}$ or $1-\alpha F_{TF}/F_{TS}$). Also, instead of a frequency ratio generation, an oversampling and/or output-decimating frequency difference engine may be used to deliver a digital temperature-sense output (i.e., $\alpha(F_{TF}-F_{TS})$ or $\alpha(F_{TS}-F_{TF})$) to downstream circuits.

Figure 2:
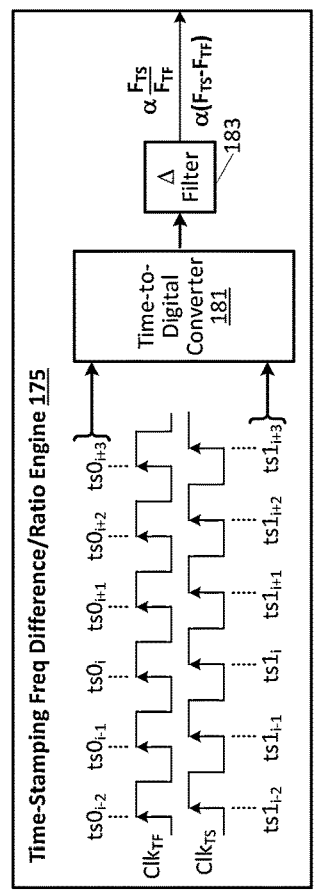
FIG. 2 illustrates an embodiment of a multi-die integrated-circuit (IC) package that implements temperature-flat and temperature-sensitive oscillators corresponding to those shown in FIG. 1, as well as an output-decimating frequency-ratio engine.

FIG. 2 illustrates an embodiment of a multi-die integrated-circuit (IC) package 125 that implements MEMS temp-flat and temp-sensitive oscillators 131 and 133 corresponding to oscillators 101 and 103 in FIG. 1, as well as an output-decimating frequency-ratio engine 135. As shown, IC package 125 includes a MEMS die 127 and a logic ("CMOS") die 129, with the former including co-located temp-flat and temp-sensitive MEMS resonators 141, 143 (i.e., co-located such that the resonators are thermally coupled or otherwise subject to identical or nearly identical temperature variations) and the latter including frequency-ratio engine 135 together with respective sense/sustain circuits 145, 147 to sense and sustain resonant motion of resonators 141 and 143. Logic die 129 may additionally include circuit blocks to implement the temperature compensation, frequency synthesis and/or temperature-measurement synthesis functions shown in FIG. 1, and the multi-die package as a whole may include lead-frame or other interconnect components and/or interface circuitry (including one or more other dies). Also, as discussed, to effect a monotonic frequency-ratio (TDC) output as a function of temperature, the temp-sensitive MEMS resonator is designed to resonate at a slightly lower nominal frequency (e.g., ~45 MHz) than the temp-flat MEMS resonator (e.g., ~47 MHz) over a temperature range of interest (e.g., −45° C. to +105° C.) and to exhibit a more pronounced negative first-order TCF so that the frequency ratio generated by decimating frequency-ratio engine 135 (i.e., $\alpha F_{TS}/F_{TF}$, where a is a constant scaling factor) decreases monotonically across the temperature range of interest. These characteristics are carried forward in embodiments below, but may vary in alternative embodiments (e.g., oscillators having different frequencies than those shown, oscillators exhibiting nominally the same frequency, oscillator TCF characteristics that yield non-monotonic functions of temperature, etc.) so long as changes in oscillator frequency ratio or difference are detectable over one or more temperature ranges of interest.

Figure 3:
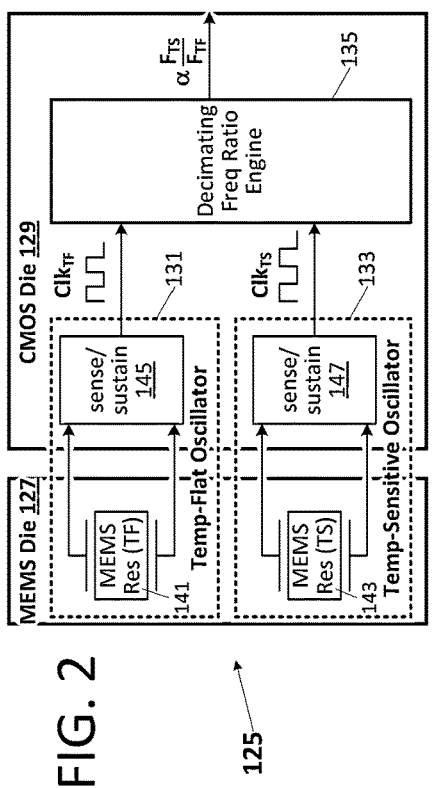
FIG. 3 illustrates an embodiment of a decimating frequency ratio engine or frequency difference engine that time-stamps transitions (edges) in the temperature-flat and temperature-sensitive clock signals.

FIG. 3 illustrates an embodiment of a decimating frequency ratio engine or frequency difference engine (175) that time-stamps transitions (edges) in the temp-flat and temp-sensitive clock signals to measure the relative times of rising and/or falling edges within the two clock signals and thus permit the time differences between counterpart edges to be measured within a time-to-digital converter 181. In one embodiment, converter 181 (e.g., a programmed digital signal processor and/or dedicated signal processing circuitry) processes the edge time-stamps to generate a sequence of frequency-difference measurements at a data rate that is reduced within decimating filter 183 (e.g., combination of a sinc filter or other decimating filter with a low-pass filter) to produce a temperature-indicative frequency-difference measure (i.e., $\alpha F_{TS}-F_{TF}$), a temperature-to-digital conversion). Alternatively or additionally, converter 181 may process the edge time stamps to generate a sequence of frequency-ratio measurements (e.g., determining the frequency of each clock signal according to respective edge-to-edge timing and then generating a ratio of those frequencies, $\alpha F_{TS}/F_{TF}$), again with data-rate reduction within decimating filter 183 to yield a finalized temperature-to-digital conversion. Note that while rising-edge time stamping is depicted, falling clock edges or both rising and falling clock edges may be time-stamped in alternative embodiments.

Figure 4:
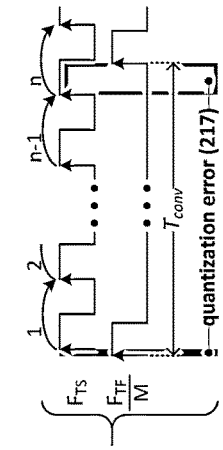
FIG. 4 illustrates an embodiment of a reciprocal frequency ratio engine in which the phase one of the two MEMS-based clock signals is quantized by the other.
Figure 4:
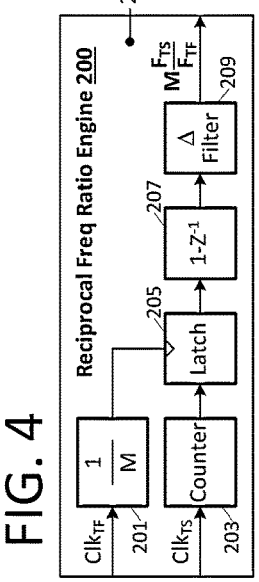

FIG. 4 illustrates an embodiment of a reciprocal frequency ratio engine 200 in which the phase of one of the two MEMS-based clock signals—the temp-flat clock ($Clk_{TF}$) in this example—is used to quantize the other; a reciprocal sampling approach that avoids the complexity of an oversampling clock source. In the depicted implementation, the temp-flat clock is frequency divided by M within clock divider 201 to yield a conversion window that spans multiple ('n') temp-sensitive clock cycles as shown at 215. More specifically, every Mth rising edge of $Clk_{TF}$ latches the output of cycle counter 203 (which counts $Clk_{TS}$ cycles) within latch (or register) 205. Difference circuit 207 (which may be understood also to be clocked by $Clk_{TF}$/M) subtracts the prior cycle-count value from each newly latched cycle-count value to yield a frequency ratio value $M*F_{TS}/F_{TF}$ (where '*' denotes multiplication) that is output-rate-decimated and low-pass filtered within decimating filter 209. As with other instances below, difference circuit 207 is denoted according to the discrete-time expression of successive-sample subtraction operation $(1-Z^{-1})$ and, despite absence of a clocking input, should be understood to be clocked at the sampling rate (i.e., $F_{TF}$/M in this example).

While the reciprocal frequency ratio generator of FIG. 4 is sufficient for some applications, the quantization error (shown at 217) in each sample averages to +/− half the $Clk_{TS}$ cycle time (half the $Clk_{TS}$ period) so that the output convergence time (i.e., number of sampling cycles required for quantization error to asymptote to zero) may be intolerably long for precision timekeeping applications (e.g., telecommunications applications, data communications applications, etc.).

Figure 5:
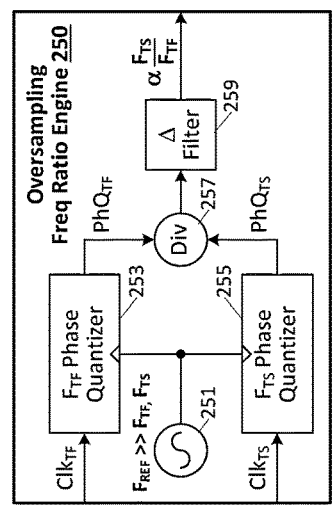
FIG. 5 illustrates an alternative embodiment of a frequency ratio engine in which a reference clock generator is provided to oversample a pair of MEMS-based clock signals.

FIG. 5 illustrates an alternative embodiment of a frequency ratio engine 250 in which a reference clock generator 251 (and thus, after counting the MEMS-based $Clk_{TF}$ and $Clk_{TS}$ generators, a third clock signal generator) is provided to oversample the temp-flat and temp-sensitive clock signals with substantially reduced quantization error and thereby expedite (speed up) frequency-ratio convergence. In the embodiment shown, the reference clock, which oscillates at frequency ($F_{REF}$) substantially higher than either of temp-flat and temp-sensitive clocks (i.e., $F_{REF} \gg F_{TF}, F_{TS}$), is supplied to phase quantizers 253 and 255 to enable generation of respective $Clk_{TS}$ and $Clk_{TF}$ phase quantizations ($PhQ_{TF}$ and $PhQ_{TS}$) —that is, quantization of the time interval between selected edges of the oversampled clock signal. The two phase quantization values reflect the $Clk_{TF}$ and $Clk_{TS}$ clock frequencies, respectively, and are supplied to divider circuit 257 (which may alternatively be a difference circuit to enable frequency difference generation) to yield a frequency ratio output which is decimated and filtered within decimating filter 259, thus producing a sequence of scaled, digitized frequency ratio values $\alpha F_{TS}/F_{TF}$.

Figure 6:
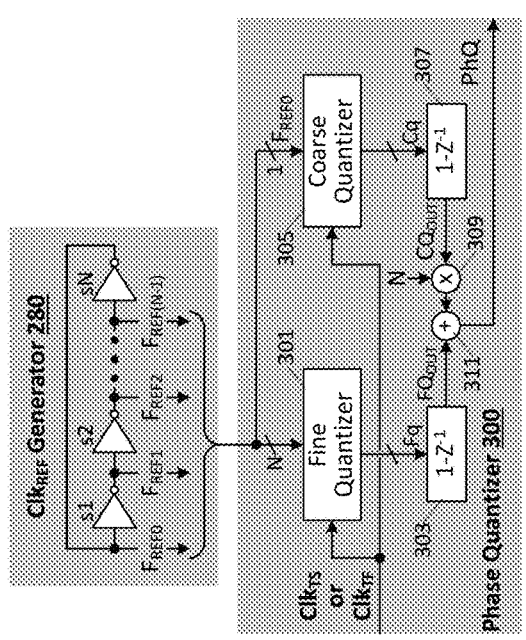
FIG. 6 illustrates a more detailed embodiments of a reference clock generator and phase quantizer that may be used to implement the reference clock generator and either or both of the phase quantizers shown in FIG. 5.

FIG. 6 illustrates a more detailed embodiments of a reference clock generator 280 and phase quantizer 300 that may be used to implement the reference clock generator and either or both of the phase quantizers shown in FIG. 5. In the implementation shown, reference clock generator 280 is implemented by an N-stage ring oscillator (i.e., daisy-chained set of N inverter stages s1, s2, . . . , sN in which the final inverter output feeds the initial inverter input) that oscillates at a frequency, $F_{REF}$, according to the propagation delay through the inverter chain. To enable quantization with sub reference-cycle resolution, all sub-phases of the ring oscillator (i.e., $F_{REF0}$-$F_{REF(N-1)}$ and thus the output of each inverter in the chain) are supplied to phase quantizer 300. More specifically, in the depicted example, all sub-phases of ring oscillator 280 are supplied to a fine quantizer component 301 of phase quantizer 300 and an arbitrary one of those sub-phases ($F_{REF0}$ in this example) is supplied to a coarse quantizer component 305. In one embodiment, coarse quantizer 305 is implemented by a modulo counter that counts cycles of the selected reference clock phase (i.e., counts cycles of the reference clock) over an interval established by the clock being quantized (the "object clock"—$Clk_{TS}$ in the depicted example), while fine quantizer 301 resolves the timing of the object clock edge with respect to the sub-phase timing signals, thus refining resolution of the object clock edge to $1/N^{th}$ the reference clock cycle time to effect an $N*F_{REF}$ oversampling rate with relatively low power consumption (i.e., without requiring generation of a clock that oscillates at frequency $N*F_{REF}$).

Figure 7:
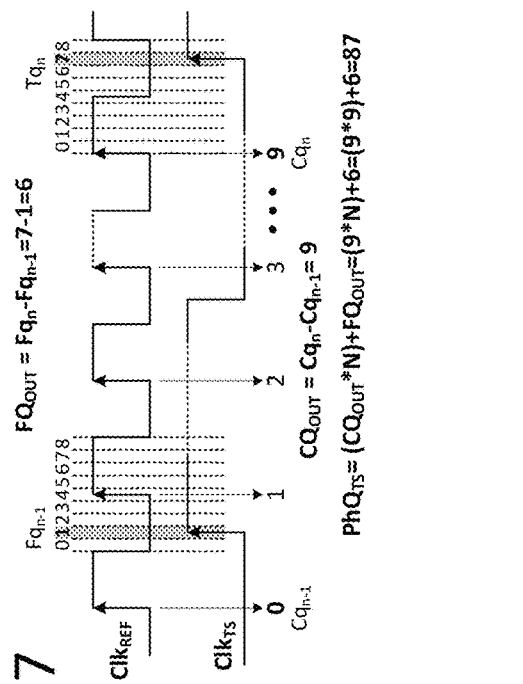
FIG. 7 illustrates exemplary operation of the coarse and fine quantizers shown in FIG. 6 in an embodiment that implements the reference clock generator of FIG. 6 as a nine-stage ring oscillator.

Still referring to FIG. 6, the outputs of the fine and coarse quantizers (Fq and Cq, respectively) are supplied to respective differencing circuits 303 and 305 to yield fine and coarse phase quantization values ($FQ_{OUT}$ and $CQ_{OUT}$), respectively. The coarse phase quantization value is scaled by N within multiplier 309 to reflect its significance (i.e., every step or increment of the coarse phase quantization value corresponds to N steps/increments of the fine phase quantization value) and summed with the fine phase quantization value in adder 311 to produce the finalized phase quantization ($PhQ_{TS}$ in this case). FIG. 7 illustrates the effect of these coarse and fine quantization operations within an embodiment having a 9-stage ring oscillator (i.e., N=9) in which successive rising sub-phase edges are used to delineate fine quantization intervals, Fq. As shown, coarse quantizer 305 counts an exemplary nine (9) cycles of the reference clock over a cycle of the sampled clock ($Clk_{TS}$) so that $CQ_{OUT}$=9−0=9, and fine quantizer 301 captures successive sub-phase measures of 1 and 7 with respect to the rising edges that bound that same $Clk_{TS}$ cycle to yield $FQ_{OUT}$=7−1=6. The coarse phase quantization value is scaled (by N=9) and added to the fine phase quantization value to produce a finalized phase quantization of $PhQ_{TS}$=87. That is, in the example shown, 87 sub-phase quantization steps transpire between successive rising edges of the sampled clock, $Clk_{TS}$.

Figure 8:
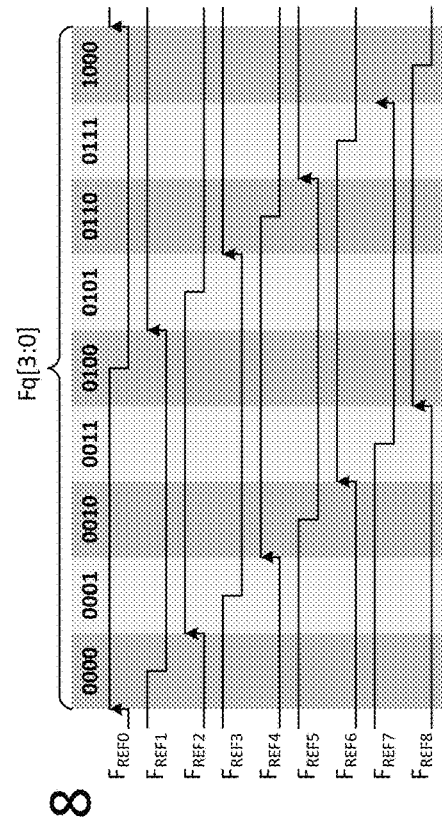
FIG. 8 illustrates an exemplary set of time-staggered sub-phase timing signals generated by a nine-stage ring-oscillator reference clock generator and an exemplary set of sub-phase quantization values that correspond to respective states of the sub-phase timing signals at each rising sub-phase edge.

FIG. 8 illustrates an exemplary set of time-staggered sub-phase timing signals generated by a 9-stage ring-oscillator reference clock generator and an exemplary set of sub-phase quantization values that correspond to respective states of the sub-phase timing signals at each rising sub-phase edge. That is, during the interval between each pair of rising sub-phase edges (e.g., interval between rising edge of $F_{REF0}$ to rising edge of $F_{REF2}$; interval between rising edge of $F_{REF2}$ to rising edge of $F_{REF4}$, . . . , interval between rising edge of $F_{REF5}$ and rising edge of $F_{REF7}$), the sub-phase timing signals may be characterized collectively by a unique one of nine possible state combinations. Accordingly, by sampling the states of the sub-phase signals in response to object clock edge (i.e., transition of the clock being quantized), a sub-phase progression or fine-quantization state (Fq) of the ring oscillator may be captured. In one embodiment, the fine-quantization states are encoded into a binary numeric value (e.g., four-bit value Fq[3:0] in accordance with the number of possible states) to facilitate sample-to-sample subtraction within differencing circuit 303 of FIG. 6. In alternative embodiments an un-encoded (one-hot) Fq value may be output to the differencing circuit and/or other downstream processing circuitry.

Figure 9:
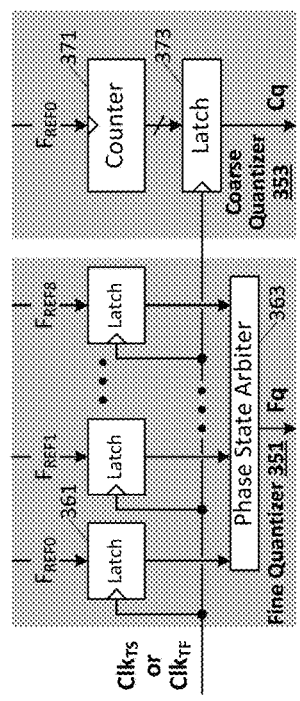
FIG. 9 illustrates an embodiment of a fine quantizer that operates in accordance with sub-phase state distinctions shown in FIG. 8, together with a coarse quantizer embodiment implemented by a counter and latch.

FIG. 9 illustrates an embodiment of a fine quantizer 351 that operates in accordance with sub-phase state distinctions shown in FIG. 8, together with a coarse quantizer embodiment 353 (implemented by a counter 371 and latch 373) —structures may be used to implement like-named components within FIG. 6 phase quantizer 300. Referring specifically to fine quantizer 351, a set of latch elements 361 are coupled to sample respective sub-phases of the reference clock signal in response to object clock edges (i.e., each rising edge of $Clk_{TS}$ in this example). The latch outputs (i.e., sub-phase state samples) are supplied to a phase-state arbiter 363 having combinatorial logic to resolve the latch states in to a fine-quantization output having one of nine values, Fq, as shown in FIG. 8.

Reflecting on FIGS. 8 and 9, the number of fine-quantization states (and thus the number of latch elements 361 and phase-state arbiter implementation within fine quantizer 351) scales according to the number of ring oscillator stages within the reference clock generator (i.e., element 280 of FIG. 6). Also, while rising-edge to rising-edge phase-state intervals are shown in FIG. 8, it can be seen that each such interval may be subdivided into two intervals according to the state of a sub-phase that transitions at the midpoint of each interval (see transition of $F_{REF1}$ at the midpoint of Fq interval 0000, for example) —that is that there are in reality 2N distinguishable phase-state intervals per reference clock cycle if rising-to-falling and falling-to-rising edge delays (as opposed to just rising-to-rising edge delays) are used to define the phase-state intervals. Accordingly, in embodiments where systemic differences between rising-to-falling and falling-to-rising edge delays are negligible or otherwise tolerable, a more resolute (2N) sub-phase quantization may be achieved through modification of the phase-state arbiter 363.

Returning briefly to FIG. 5, and assuming that reference clock generator 251 is implemented by the ring-oscillator embodiment shown in FIG. 6 (and each of the phase quantizers 253 and 255 is implemented by phase quantizer 300 of FIG. 6), intrinsic noise characteristics of the ring oscillator $F_{REF}$ generator, particularly low frequency phase noise (e.g., 1/F noise), may limit meaningful resolution of the temperature-detect output. While that phase noise floor may be tolerable in some applications, lower-noise reference clock generator circuits may be used in place of the ring oscillator in alternative embodiments (including, for example and without limitation, LC or LRC oscillator circuits) to increase resolution of the temperature sense output. In case of LC oscillators or other oscillators that lack sub-phase timing signals, resonant frequencies may be chosen to yield higher reference clock rates and thus a desired oversampling rate.

Figure 10:
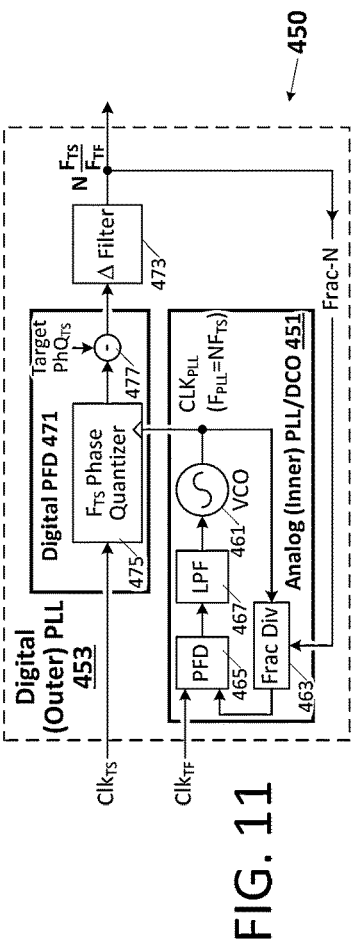
FIG. 10 illustrates an alternative frequency ratio engine implementation in which a ring-oscillator reference clock generator is operated as a voltage controlled oscillator and phase-locked to one of two MEMS-based clock signals within a phase-locked-loop (PLL) circuit.

FIG. 10 illustrates an alternative frequency ratio engine implementation in which a ring-oscillator reference clock generator 411 is operated as a voltage controlled oscillator (e.g., by current-starving the inverter stages) and phase-locked to one of the MEMS-based clock signals—$Clk_{TF}$ in this example—within a phase-locked-loop (PLL) circuit 401. By this arrangement, low frequency phase noise within the ring oscillator/voltage-controlled oscillator (VCO) is largely eliminated as the ring-oscillator is iteratively phase aligned with the much more frequency-stable MEMS-based clock by the negative-feedback operation of PLL 401 (i.e., via the feedback loop formed by divider 415, phase/frequency detector 417 and loop filter 419). Moreover, because the ring oscillator output frequency (i.e., VCO output frequency) is locked to n*FTF according to the PLL divide ratio implemented within divider 415, quantization of the $Clk_{TF}$ phase is inherent in the PLL output (i.e., $F_{PLL}=n*F_{TF}$) so that only a single phase quantizer is required to produce the frequency-ratio output. Thus, $Clk_{TS}$ is quantized within phase quantizer 425 (e.g., implemented in accordance with embodiments shown in FIGS. 6-9) to produce a stream of phase quantization values (PhQTS). The phase quantization stream is supplied, in turn, to decimating filter 427 to yield a reduced data rate and filtered frequency ratio output ▫ $F_{TS}/F_{TF}$.

Figure 11:
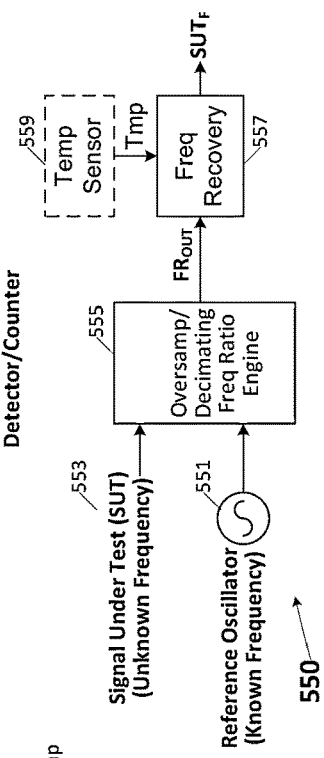
FIG. 11 illustrates an embodiment of a loop-stabilized frequency ratio engine in which a voltage-controlled ring oscillator (reference clock generator) is phase locked to each of two MEMS-based clock signals by a nested pair of PLLs.

FIG. 11 illustrates alternative embodiment of a loop-stabilized frequency ratio engine 450 that phase-locks a voltage-controlled ring oscillator 461 (reference clock generator) to both the temp-flat and temp-sensitive MEMS clock signals ($Clk_{TF}$ and $Clk_{TS}$) through a nested pair of phase-locked loops 451 and 453. In the particular embodiment shown, inner PLL 451 is implemented by an analog fractional-N PLL (i.e., a PLL that implements a fractional clock division through a feedback loop formed by fractional divider 463, phase/frequency detector 465 and loop filter 467), and outer PLL 453 is implemented as a digital PLL (having a digital phase/frequency detector 471 and decimating loop filter 473) and in which the output of loop filter 473 constitutes the fractional-N divide value supplied to the Frac-N divider circuit within the inner loop. Thus, because the inner PLL output (i.e., $Clk_{PLL}$ having frequency $F_{PLL}$) is controlled by the digital input to fractional divider circuit 463, inner PLL 451 may be viewed as a digitally controlled oscillator (i.e., DCO) whose output is phase locked to $Clk_{TS}$ by outer PLL 453. Further, in the particular embodiment shown, digital phase/frequency detector 471 within outer PLL 453 is implemented by a phase quantizer 475 (e.g., as described in reference to FIGS. 6-9) and a target-phase comparator 477—in this case, a subtractor circuit that subtracts a target quantization value "Target $PhQ_{TS}$" from each quantization value generated by phase quantizer 471 to deliver a digital phase/frequency error value to decimating loop filter 473. By setting the target quantization value to an integer number (N) of DCO ($Clk_{PLL}$) cycles, the interior-loop VCO 461 is locked to $N*F_{TS}$ so that the Frac-N digital value returned to fractional divider 463 is driven, by error-correcting negative feedback of the inner and outer Pas to $N*F_{TS}/F_{TF}$ and thus to a scaled frequency ratio of the two MEMS-based input clocks that may be delivered to downstream logic circuits as a digitized temperature representation.

Still referring to FIG. 11, where VCO 461 is instantiated by a nine-stage ring-oscillator (e.g., as discussed in reference to FIGS. 7-9) and in which outer PLL 453 locks the VCO frequency to $10*Clk_{TS}$, then the Target $PhQ_{TS}$ value may be fixed (or programmably set) at 90 (i.e., nine fine phase quantization steps per $Clk_{PLL}$ cycle*10 $Clk_{PLL}$ cycles per $Clk_{TS}$ cycle). Assuming a 45 MHz/47 MHz nominal $Clk_{TS}/Clk_{TF}$ ratio (i.e., according to the exemplary embodiment discussed in reference to FIG. 1), a nominal fractional-N value between 9 and 10 will be generated by decimating filter 473 and supplied to fractional-divide circuit 463 within inner locked loop 451.

Figure 12:
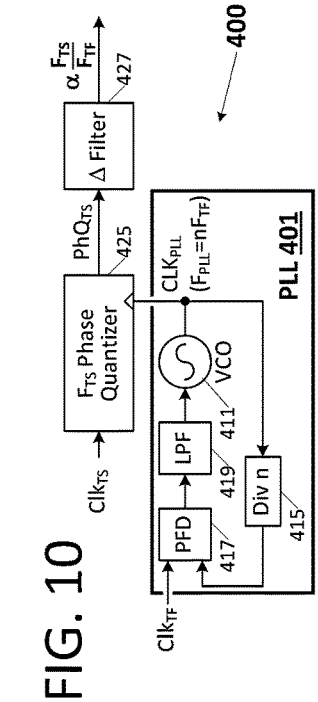
FIG. 12 illustrates an embodiment of a fractional divider that may be deployed as the fractional divider element within the inner PLL of FIG. 11 and having a sigma-delta modulator and divide-by-n circuit.

FIG. 12 illustrates an embodiment of a fractional divider 500 having a sigma-delta modulator 501 and integer clock-divider circuit (divide-by-n) 503 and that may be used to implement fractional divider element 463 within PLL 451 of FIG. 11. As shown, sigma-delta modulator 501 (a third-order instantiation in this case, though higher or lower-order modulators may be implemented) receives a sequence of fractional-N divide values and, in response, converts each into a random or pseudo-random integer sequence that averages to the fractional input value. In actual implementation, sigma delta modulator 501 may receive a stream of floating point fractional-divide values (e.g., receiving only the significand and assuming rather than receiving the scaling coefficient) or scaled fixed point fractional-divide values (again, assuming rather than receiving the fixed-point scaling factor) in either case delivering a corresponding integer output stream to clock divider 501. Exemplary integer output sequences extending over a range of eight values (i.e., in due to the third-order sigma-delta modulator implementation) are shown in FIG. 12 to demonstrate the randomizing operation effected by the sigma-delta modulator. In general, the upstream digital filter/decimator (i.e., element 473 of FIG. 11) reduces the Frac-N rate as necessary to enable the sigma-delta modulator and integer clock divider to implement the fractional divide (i.e., data rate is decimated as necessary to ensure time for the sigma-delta modulator to sufficiently modulate each incoming fractional-divide value) and thereby yield a feedback clock ($F_{PLL}$/Frac-N) that is phase and frequency locked to $Clk_{TF}$.

Figure 13:
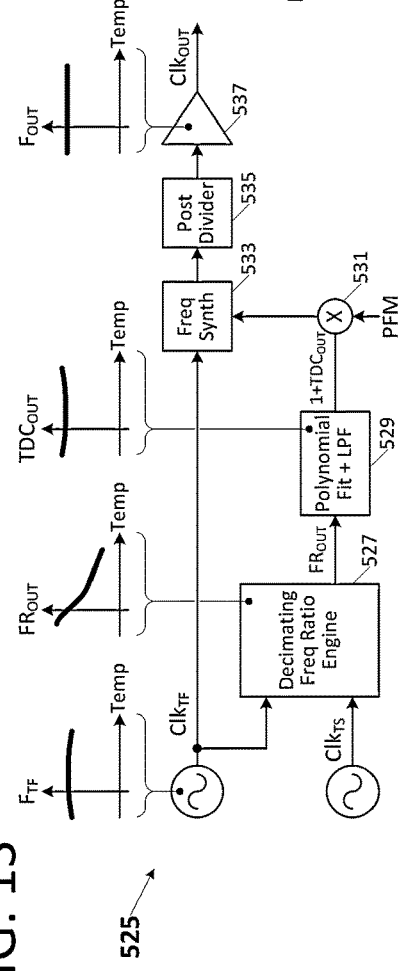
FIG. 13 illustrates a more detailed implementation of a temperature-compensated MEMS-based that leverages the various dual resonator frequency ratio (or frequency difference) engines discussed above to produce temperature stable output clock across a frequency range of interest.

FIG. 13 illustrates a more detailed implementation of a temperature-compensated MEMS oscillator 525 that leverages one or more of the dual-resonator temperature sensors discussed above to produce an output clock signal, $Clk_{OUT}$, characterized by near-perfect frequency stability across a temperature range of interest. In the embodiment shown, decimating frequency ratio engine 501 supplies a stream of digitized temperature-sense values (i.e., frequency ratio values $FR_{OUT}$) to a polynomial-fit and low-pass-filter stage 529 which outputs, in response, a sequence of temperature-dependent compensation values ($1+TDC_{OUT}$). More specifically, the polynomial circuit yields, for each possible value of the incoming frequency ratio (i.e., each possible digital temperature indication), a temperature error correction value that is the inverse of the temperature error value of the $Clk_{TF}$ oscillator (the latter being obtained, for example, by production-time characterization of the temp-flat MEMS resonator and associated oscillator circuitry) at the frequency-ratio-indicated temperature. Accordingly, after low-pass filtering, the polynomial circuit output reflects a scaling factor ($1+TDC_{OUT}$) that, when multiplied by (i) the programmable frequency multiplier (PFM) within circuit 531 and (ii) by $Clk_{TF}$ clock signal in frequency synthesizer 533, flattens the temperature dependence of the frequency synthesizer output over the frequency range of interest. Accordingly, frequency-division of the frequency-synthesizer output within post divider 535 and output via output driver 537 yields an output clock signal $Clk_{OUT}$ having an exceedingly low frequency deviation (e.g., on the order of 100 ppb or less) over the target operational temperature range of the clock generator.

Figure 14:
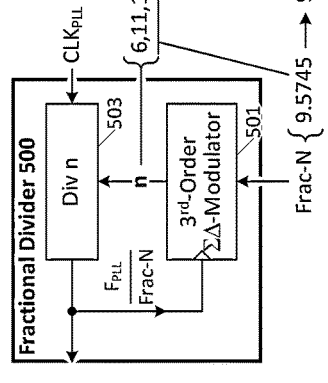
FIG. 14 illustrates an embodiment of a frequency counter circuit that leverages one or more of the frequency ratio engines and/or frequency-difference engines disclosed herein.

FIG. 14 illustrates an embodiment of a frequency detector (or frequency counter) 550 that leverages a frequency ratio engine as disclosed herein to detect (or count) the frequency of a signal under test (SUT) 553. In the embodiment shown, a reference clock generated by reference oscillator 551 and the signal under test are supplied to an oversampling and/or decimating frequency ratio engine 555 to produce a frequency ratio, $FR_{OUT}$. The frequency ratio is supplied, in turn, to a frequency recovery module 557 which multiplies (or divides) the frequency ratio by the known frequency of the reference oscillator (and any scaling factor in the frequency-ratio output) to recover a digital value representative of the frequency of the signal under test, $SUT_F$. In one embodiment, the reference oscillator is implemented by the clock generator shown in FIG. 13 (or other clock generator having a frequency-stable output) so that the known reference oscillator frequency remains virtually unchanged over an operational temperature range of the frequency detector system. Alternatively, temperature dependence of the reference oscillator may be mapped within frequency recovery module 557 and a temperature sensor 559 (including one or more temperature sensors implemented as described herein) may provide a temperature detect signal (Tmp) to index the temperature-dependent frequency map of the reference oscillator and thereby determine the frequency of the reference oscillator at the instant temperature.

Still referring to FIG. 14, instead of frequency ratio engine 555, frequency detector/counter 550 may include a frequency difference engine that outputs a frequency difference value to frequency recovery module 557. In that case, frequency recovery module may effect a subtraction (or addition) of the known (or temperature corrected) reference oscillator frequency to recover a digitized representation of the frequency of the signal under test.

The various circuits and MEMS structures disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, temperatures, time periods, signal levels, power levels, signaling or operating frequencies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A device comprising:
    a first microelectromechanical systems (MEMS) structure having a body that is to move or deflect;
    a second MEMS structure having a body that is to move or deflect; and
    circuitry to generate temperature correction information dependent on the movement or deflection of each of the body of the first MEMS structure and the body of the second MEMS structure; and
    circuitry to process a signal representing measurement of the movement or deflection of the body of the first MEMS structure, in dependence on the temperature correction information, to produce an output;
    wherein the device comprises a first die and a second die mounted to the first die, wherein the first die carries the first MEMS structure and the second MEMS structure, wherein the second die carries the circuitry to generate and the circuitry to process, and wherein the device comprises a pin to carry the output.

2. A device comprising:
    a first microelectromechanical systems (MEMS) structure having a body that is to move or deflect;
    a second MEMS structure having a body that is to move or deflect; and
    circuitry to generate temperature correction information dependent on the movement or deflection of each of the body of the first MEMS structure and the body of the second MEMS structure; and
    circuitry to process a signal representing measurement of the movement or deflection of the body of the first MEMS structure, in dependence on the temperature correction information, to produce an output;
    wherein the signal is a first signal, wherein the circuitry to generate comprises a frequency ratio engine that is to perform at least one of an oversampling function or a decimation function with respect to the first signal, in dependence on a second signal representing the movement or deflection of the body of the second MEMS structure.

3. The device of claim 2, wherein the circuitry to process is use a polynomial to correct for non-linear variation of the signal with respect to temperature, in dependence on the temperature correction information, such that the output exhibits less non-linear variation with respect to temperature than does the first signal.

4. A device comprising:
    a first microelectromechanical systems (MEMS) structure having a body that is to move or deflect;
    a second MEMS structure having a body that is to move or deflect; and
    circuitry to generate temperature correction information dependent on the movement or deflection of each of the body of the first MEMS structure and the body of the second MEMS structure; and
    circuitry to process a signal representing measurement of the movement or deflection of the body of the first MEMS structure, in dependence on the temperature correction information, to produce an output;
    circuitry to generate a sampling clock dependent on the movement or deflection of the body of the second MEMS structure; and
    circuitry to sample the movement or deflection of the body of the first MEMS structure according to the sampling clock.

5. The device of claim 1, wherein the first MEMS structure and the second MEMS structure are each resonators.

6. The device of claim 5, wherein the body of the first MEMS resonator is to vibrate with a first resonant frequency, wherein the body of the second MEMS resonator is to vibrate with a second resonant frequency, and wherein the second MEMS frequency differs from the first MEMS frequency by at least one megahertz.

7. The device of claim 5, wherein the body of the first MEMS resonator is to vibrate with a first resonant frequency, wherein the second MEMS resonator is to vibrate with a second resonant frequency, and wherein the first MEMS resonator and the second MEMS resonator are configured such that the first resonant frequency diverges monotonically with frequency from the second resonant frequency as a function of temperature.

8. The device of claim 1, wherein the body of the first MEMS structure and the body of the second MEMS structure are each characterized by a respective temperature-dependent stiffness characteristic, and wherein the first MEMS structure and the second MEMS structure are configured such that a ratio of a parameter representing the movement or deflection for the body of the first MEMS structure to a parameter representing the movement or deflection for the body of the second MEMS structure varies monotonically over a temperature range of minus 45° C. to plus 105° C.

9. The device of claim 1, wherein the second die comprises quantization circuitry that is to receive the signal and generate a quantized output, and wherein the circuitry to generate the temperature-correction information is to do so in dependence on the quantized output.

10. The device of claim 1, wherein the second die comprises a decimating filter that is to receive the signal and generate a decimated output, and wherein the circuitry to generate the temperature-correction information is to do so in dependence on the decimated output.

11. A device comprising:
    a first die having a first microelectromechanical systems (MEMS) structure having a body that is to move or deflect and a second MEMS structure having a body that is to move or deflect; and a second die having circuitry to generate temperature correction information dependent on the movement or deflection of each of the body of the first MEMS structure and the body of the second MEMS structure and circuitry to process a first signal representing measurement of the movement or deflection of the body of the first MEMS structure in dependence on the temperature correction information;

wherein the device is to produce an output dependent on the processed signal; and wherein the device further comprises circuitry to generate a sampling clock dependent on the movement or deflection of the body of the second MEMS structure, and circuitry to sample the movement or deflection of the body of the first MEMS structure according to the sampling clock.

12. The device of claim 11, wherein the first MEMS structure and the second MEMS structure are each resonators.

13. The device of claim 12, wherein the body of the first MEMS resonator is to vibrate with a first resonant frequency, wherein the body of the second MEMS resonator is to vibrate with a second resonant frequency, and wherein the second MEMS frequency differs from the first MEMS frequency by at least one megahertz.

14. The device of claim 12, wherein the body of the first MEMS resonator is to vibrate with a first resonant frequency, wherein the body of the second MEMS resonator is to vibrate with a second resonant frequency, and wherein the first MEMS resonator and the second MEMS resonator are configured such that the first resonant frequency and the second resonant frequency monotonically diverge with temperature.

15. The device of claim 11, wherein the body of the first MEMS structure and the body of the second MEMS structure are each characterized by a respective temperature-dependent stiffness characteristic, and wherein the first MEMS structure and the second MEMS structure are configured such that a ratio of a parameter representing the movement or deflection for the body of the first MEMS structure to a parameter representing the movement or deflection for the body of the second MEMS structure varies monotonically over a temperature range of minus 45° C. to plus 105° C.

16. A device comprising:

a first die having a first microelectromechanical systems (MEMS) structure having a body that is to move or deflect and a second MEMS structure having a body that is to move or deflect; and a second die having circuitry to generate temperature correction information dependent on the movement or deflection of each of the body of the first MEMS structure and the body of the second MEMS structure and circuitry to process a first signal representing measurement of the movement or deflection of the body of the first MEMS structure in dependence on the temperature correction information;

wherein the device is to produce an output dependent on the processed signal; and wherein the circuitry to generate the temperature correction information comprises a frequency ratio engine that is to perform at least one of an oversampling function or a decimation function with respect to the first signal, in dependence on a second signal representing the movement or deflection of the second MEMS structure.

17. A device comprising:

a first die having a first microelectromechanical systems (MEMS) structure having a body that is to move or deflect and a second MEMS structure having a body that is to move or deflect; and a second die having circuitry to generate temperature correction information dependent on the movement or deflection of each of the body of the first MEMS structure and the body of the second MEMS structure and circuitry to process a first signal representing measurement of the movement or deflection of the body of the first MEMS structure in dependence on the temperature correction information;

wherein the device is to produce an output dependent on the processed signal; and wherein the circuitry to process is use a polynomial to correct for non-linear variation of the first signal with respect to temperature, in dependence on the temperature correction information, such that the output exhibits less non-linear variation with respect to temperature than does the first signal.

* * * * *